United States Patent [19]

Koch et al.

[11] Patent Number: 4,679,111
[45] Date of Patent: Jul. 7, 1987

[54] RESISTANCE TO GROUND CHECKER

[75] Inventors: Karl C. Koch, Swissvale; Charles W. Einolf, Jr., Murrysville, both of Pa.

[73] Assignee: Westinghouse Electric Corp., Pittsburgh, Pa.

[21] Appl. No.: 797,335

[22] Filed: Nov. 12, 1985

[51] Int. Cl.⁴ .............................................. H02H 7/08
[52] U.S. Cl. ........................................ 361/31; 361/42; 361/93
[58] Field of Search ........................ 361/23, 31, 33, 42, 361/45, 87, 93; 324/51, 546, 158 MY

[56]  References Cited

U.S. PATENT DOCUMENTS

| | | | |
|---|---|---|---|
| 2,895,104 | 7/1959 | Hansen et al. | 324/51 |
| 3,141,128 | 7/1964 | Behr | 324/51 |
| 3,611,036 | 10/1971 | Edson | 340/648 X |
| 3,728,617 | 4/1973 | Potter | 324/51 |
| 3,852,642 | 12/1974 | Engel et al. | 361/45 |
| 3,870,954 | 3/1975 | Hanson et al. | 324/158 MY |
| 3,968,409 | 7/1976 | Windler | 361/42 |
| 4,002,968 | 1/1977 | Reid | 324/51 |
| 4,191,954 | 3/1980 | Faris et al. | 340/679 |
| 4,197,532 | 4/1980 | Lawson II | 340/648 |
| 4,200,836 | 4/1980 | Okada et al. | 324/51 |
| 4,253,056 | 2/1981 | Chaudhary | 324/51 |
| 4,319,298 | 3/1982 | Davis et al. | 361/24 |

FOREIGN PATENT DOCUMENTS 168378 10/1981 Netherlands ...................... 361/42

*Primary Examiner*—A. D. Pellinen
*Assistant Examiner*—Derek S. Jennings
*Attorney, Agent, or Firm*—Daniel C. Abeles

[57]     ABSTRACT

A circuit arrangement for monitoring ground faults to a normally ungrounded coil of a motor, the circuit arrangement including;

a source of a low-level d.c. voltage, the source having first and second output terminals between which the d.c. voltage is established and a conductive connection being established between the first output terminal and the motor coil;

a current responsive unit connected between a point at ground potential relative to the motor coil and the second output terminal of the source for producing an output signal proportional to the amplitude of current flow between the second terminal and ground; and a motor control unit connected for preventing operation of the motor when the output signal from the current responsive means reaches a selected value.

14 Claims, 1 Drawing Figure

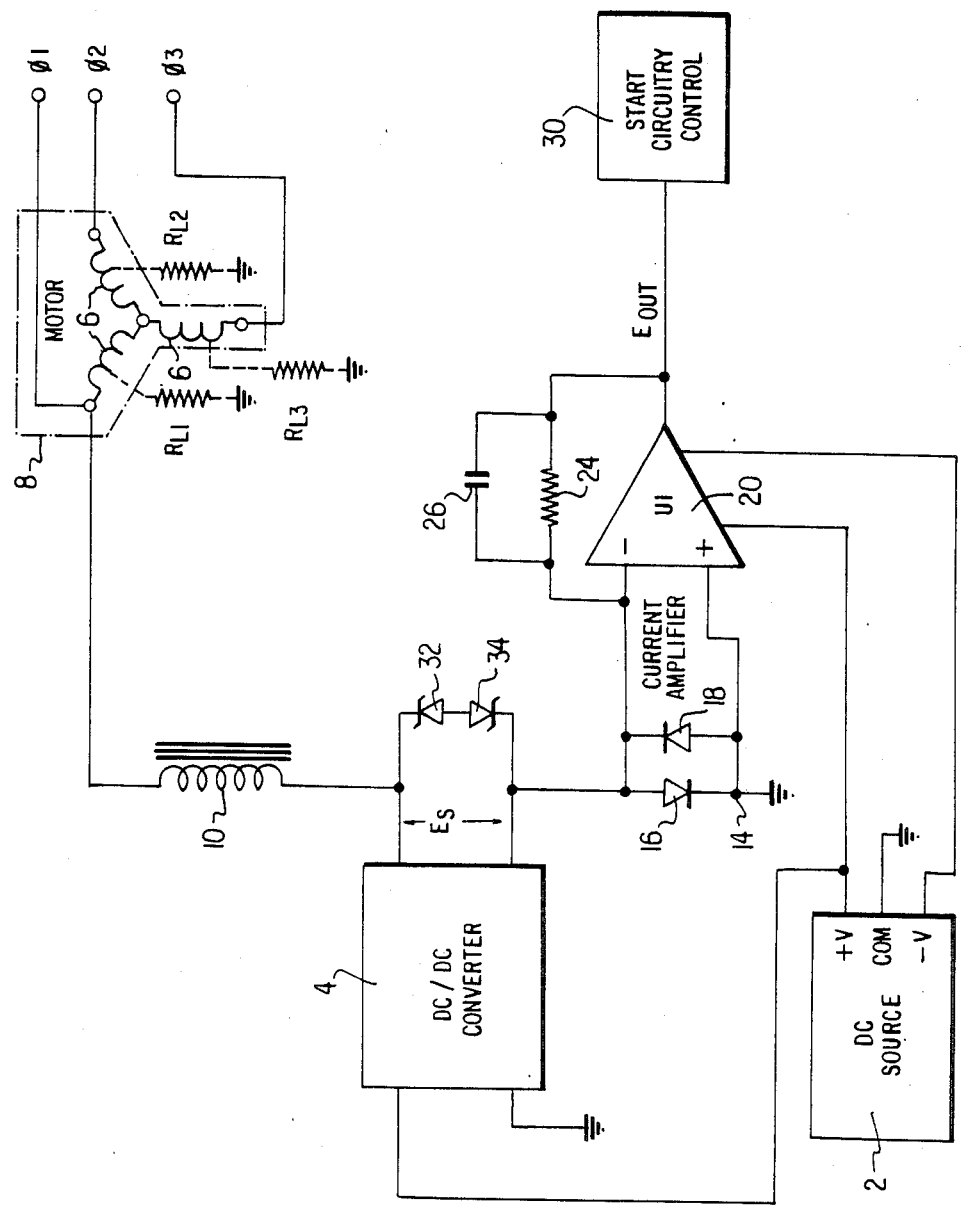

RESISTANCE TO GROUND CHECKER

BACKGROUND OF THE INVENTION

The present invention relates to the monitoring of resistance to ground, particularly in electric motors.

In electrical equipment, such as large motors, faults to ground can develop due, for example, to moisture, dropped maintenance tools, etc.

Various types of monitoring systems which have already been proposed possess certain drawbacks. By way of example, a device designated an M-HV Failsafe Motor Protector is manufactured by Marine Safe Electronics, Ltd., of Concord, Ontario, Canada. While this device will respond satisfactorily to high leakage resistance values, it cannot be relied upon to respond to low leakage resistance values.

SUMMARY OF THE INVENTION

It is an object of the invention to reliably monitor the resistance to ground in large motors prior to start-up.

A further object of the invention is to use a low current to effect such detection.

A further object of the invention is to effect such detection in a safe manner and with an inexpensive circuit arrangement.

The above and other objects are achieved, according to the present invention, by a circuit arrangement for monitoring ground resistance to a normally ungrounded coil of a motor, which circuit arrangement includes:

a source of low-level d.c. voltage, the source having first and second output terminals between which the d.c. voltage is established;

means for establishing a conductive connection between the first output terminal and the motor coil;

grounding means for connection to a point at ground potential relative to the motor coil;

current responsive means connected between the grounding means and the second output terminal of the source for producing an output signal proportional to the amplitude of current flow between the second terminal and the grounding means when the grounding means are connected to the point at ground potential; and motor control means connected for preventing operation of the motor when the output signal from the current responsive means reaches a selected value.

BRIEF DESCRIPTION OF THE DRAWING

The sole FIGURE is a circuit diagram illustrating a preferred embodiment of the invention.

DESCRIPTION OF THE PREFERRED EMBODIMENTS

The circuit arrangement shown in the FIGURE includes a DC source 2 and a DC/DC converter 4 connected to receive a d.c. voltage from source 2 and constituting an isolated, or floating, d.c. source for the ground fault test circuit.

The test circuit is here provided to test for ground faults to any field winding 6 of a large motor 8. Field windings 6 are here connected in a star configuration with an ungrounded neutral point.

One output terminal of converter 4 is connected via a high voltage isolation inductor 10 to the input side of one of the coils 6. The other output terminal of converter 4 is connected to a ground point 14 via diodes 16 and 18 connected in parallel opposition.

Diodes 16 and 18 are connected across the inputs of a differential amplifier 20 and a feedback resistor 24 and a filter capacitor 26 are connected together in parallel between the output and inverting input of amplifier 20. Operating power for amplifier 20 is provided by source 2. The output of amplifier 20 is supplied to a start circuitry control 30 for motor 8. Capacitor 26 is given a value which enables it to adequately filter out 60 Hz signals which are fed into the power leads between control 30 and motor 8.

Two zener diodes 32 and 34 are connected back-to-back in series across the outputs of converter 4. The reverse breakdown voltages of diodes 32 and 34 are no lower than the output voltage, $E_s$, of converter 4, but are sufficiently low to assure that the current flowing when motor 8 is in operation will not damage converter 4. Similarly, diodes 16 and 18 protect amplifier 20 against excessively high input voltages.

Normally, field windings 6 of motor 8 are substantially fully insulated from ground. However, a fault may develop, creating a current path between one of coils 6 and ground. Such faults are represented in dotted lines in the FIGURE by resistors $R_{L1}$, $R_{L2}$ and $R_{L3}$. When motor 8 is first placed into operation, the existence of a fault path having a sufficiently low resistance can result in a fault current which will do substantial damage to motor 8.

Any ground falt which does create a current flow path between one or more of stators 6 and ground, as represented by resistances $R_{L1}$, $R_{L2}$ and $R_{L3}$, will establish a current flow path, via inductor 10 and diodes 16 and 18, between the output terminals of converter 4. The resulting voltage drop across diodes 16 and 18, proportional to the amplitude of the current flow and inversely proportional to the fault path resistance, will produce an output voltage $E_{out}$ proportional to the fault current. When $E_{out}$ exceeds a selected threshold value, start circuitry control 30 responds by preventing motor start-up.

Because of the low d.c. resistance of inductor 10 and coils 6 and the low forward resistance of diode 18, the resistance of the fault current loop can be considered to be equal to that of the fault current path itself. If the resistance of the fault current path, or the leakage resistance, is designated $R_L$ and, as noted above, the input voltage to amplifier 20 is proportional to the fault current, the value of $R_L$ can be expressed as follows:

$$R_L = \frac{E_S \cdot R_{24}}{E_{out}}$$

where $R_{24}$ is the resistance of feedback resistor 24. Thus, $R_{24}$ can be given the value necessary for establishing the desired relation between $E_{out}$ and $R_L$, so that for a selected value of $R_L$, $E_{out}$ will have the amplitude required to influence control 30.

Because of the low d.c. resistance of coils 6, ground faults associated with all of the coils can be monitored by connection of the detection circuit to only one coil. This connection could alternatively be made to the neutral point of the three coils. In the case of coils connected in a delta configuration, connection can be made to any connection point between two adjacent coils.

For a certain class of motors, it is desirable to inhibit start-up if a leakage resistance of less than $1M\Omega/KV$ rated power is present. For checking one such motor, a device according to the invention, which operated satisfactorily to produce the desired result, was constructed utilizing IN5399 diodes for elements 16 and 18 and IN3026-18 V Zener diodes for elements 32 and 34. The supply voltage $E_S$ was set at 15 V. The output voltage $E_{out}$ can be set to any desired value, which depends primarily on the requirements of control 30. By way of example, control 30 may have an input circuit which compares $E_{out}$ with a reference voltage and which causes motor start-up to be inhibited if $E_{out}$ exceeds the reference voltage. In this case, the $E_{out}$ value which results in start-up inhibition could be determined by appropriate selection of the reference voltage value.

It will be understood that the above description of the present invention is susceptible to various modifications, changes and adaptations, and the same are intended to be comprehended within the meaning and range of equivalents of the appended claims.

What is claimed is:

1. A circuit arrangement for checking resistance to ground of a normally ungrounded coil of a motor comprising:
    a source of a low-level d.c. voltage, said source having first and second output terminals between which the d.c. voltage is established;
    means for establishing a conductive connection between said first output terminal and the motor coil;
    grounding means for connection to a point at ground potential relative to the motor coil;
    current responsive means connected between said grounding means and said second output terminal of said source for producing an output signal proportional to the amplitude of current flow between said second terminal and said grounding means when said grounding means are connected to the point at ground potential; and
    motor control means connected for preventing operation of the motor when the output signal from said current responsive means reaches a selected value.

2. A circuit arrangement as defined in claim 1 wherein said current responsive means comprise: a differential amplifier having an output and inverting and non-inverting inputs; and an impedance connected between said inputs and in series between said grounding means and said second output terminal of said source.

3. A circuit arrangement as defined in claim 2 wherein said current responsive means further comprise feedback means connected between said output and one of said inputs of said differential amplifier.

4. A circuit arrangement as defined in claim 3 wherein said feedback means comprise a resistance connected in parallel with a capacitor, said capacitor having a value selected to filter out 60 Hz current.

5. A circuit arrangement as defined in claim 2 wherein said impedance comprises a first diode connected to be forward biassed by the d.c. voltage between said output terminals of said source when a ground fault current flows between the coil and ground.

6. A circuit arrangement as defined in claim 5 further comprising a second diode connected in parallel opposition with said first diode.

7. A circuit arrangement as defined in claim 1 further comprising voltage limiting means connected to said source for limiting the voltage across said output terminals to a selected value when a current is flowing between said second terminal and said grounding means.

8. A circuit arrangement as defined in claim 7 wherein said voltage limiting means comprise at least one Zener diode connected between said output terminals of said source.

9. A circuit arrangement as defined in claim 8 wherein said at least one Zener diode is composed of two Zener diodes connected in series in a back-to-back connection.

10. A circuit arrangement as defined in claim 1 wherein said means for establishing a conductive connection comprise high voltage isolation means connected to said first output terminal and via which the conductive connection is established between said first output terminal and the motor coil.

11. A circuit arrangement as defined in claim 10 wherein said isolation means comprise an inductor.

12. A circuit arrangement as defined in claim 7 wherein said voltage limiting means are constructed for causing the selected value to which the voltage across said output terminals is limited to be at least equal to the voltage established across said output terminals by said source.

13. A circuit arrangement as defined in claim 2 wherein said impedance is conductively connected to said inputs of said differential amplifier.

14. In combination: a motor having at least one normally ungrounded coil; and a circuit arrangement for checking the resistance to ground of said normally ungrounded coil, said circuit arrangement comprising:
    a source of a low-level d.c. voltage, said source being independent of said motor and having first and second output terminals between which the d.c. voltage is established;
    means for establishing a conductive connection between said first output terminal and said coil;
    grounding means connected to a point at ground potential relative to said coil;
    current responsive means connected between said grounding means and said second output terminal of said source for producing an output signal proportional to the amplitude of current flow between said second terminal and said grounding means; and
    motor control means connected for receiving the output signal and preventing operation of said motor when the output signal reaches a selected value.

* * * * *